US005742489A

United States Patent [19]

Riesland

[11] Patent Number: 5,742,489

[45] Date of Patent: Apr. 21, 1998

[54] TRANSFORMER HOUSING AND CONNECTOR BUSHING

[75] Inventor: David H. Riesland, Dickson, Tenn.

[73] Assignee: France/Scott Fetzer Company, West Fairview, Tenn.

[21] Appl. No.: 349,401

[22] Filed: Dec. 5, 1994

[51] Int. Cl.$^6$ .................................................. H05K 7/00

[52] U.S. Cl. .................... 361/836; 174/52.1; 174/152 R; 174/DIG. 2; 336/92

[58] Field of Search .................................... 361/603, 620, 361/724, 726, 730, 747, 752, 836; 174/52.1, 52.2, 52.3, DIG. 2, DIG. 10, 142, 152 R; 336/90, 92, 96

[56] References Cited

U.S. PATENT DOCUMENTS

| | | | |
|---|---|---|---|
| 1,965,437 | 7/1934 | Staehle | 336/107 |
| 2,055,624 | 9/1936 | Dickson | 336/107 X |
| 2,114,189 | 4/1938 | Kronmiller . | |
| 2,298,336 | 10/1942 | Babb | 336/107 X |
| 2,311,128 | 2/1943 | Ranney . | |
| 2,339,088 | 1/1944 | Marsh . | |
| 2,343,725 | 3/1944 | Wilson . | |
| 2,359,186 | 9/1944 | Zelt | 336/107 X |
| 2,385,460 | 9/1945 | Omansky . | |
| 2,525,467 | 10/1950 | Zelt | 174/DIG. 2 X |
| 2,547,649 | 4/1951 | Marsh . | |
| 2,702,378 | 2/1955 | Talty | 174/DIG. 1 X |
| 2,740,905 | 4/1956 | Henderson | 174/DIG. 2 X |
| 2,779,496 | 1/1957 | Henderson | 174/DIG. 2 X |
| 2,779,812 | 1/1957 | Rowe | 174/DIG. 2 X |
| 2,823,359 | 2/1958 | Wentworth . | |
| 3,030,597 | 4/1962 | Piaia, Jr. et al. | 336/107 X |
| 3,353,130 | 11/1967 | Silverstein . | |
| 3,388,299 | 6/1968 | Brideweser et al. | 361/603 |
| 3,947,795 | 3/1976 | Donnelly et al. . | |
| 4,611,093 | 9/1986 | Farmer et al. | 174/152 R |
| 4,677,255 | 6/1987 | Cumley | 174/87 |
| 4,878,639 | 11/1989 | Tempco | 248/73 |
| 5,168,422 | 12/1992 | Duncan | 361/377 |

FOREIGN PATENT DOCUMENTS

| | | | |
|---|---|---|---|
| 622655 | 6/1961 | Italy | 336/107 |

*Primary Examiner*—Kristine L. Kincaid
*Assistant Examiner*—Hung VNgo
*Attorney, Agent, or Firm*—Wood, Herron & Evans, L.L.P.

[57] ABSTRACT

A transformer housing includes a main compartment enclosing the transformer and an auxiliary compartment. The power source is connected to the primary windings in the auxiliary compartment and the electrical load is connected to the secondary windings in the main compartment. Insulating bushings mounted to the walls of the main compartment support the connections between the secondary windings and the load, maintaining these electrical connections a sufficient distance away from the walls of the housing, and each other, to substantially prevent electrical leakage from the connections to the housing or each other.

19 Claims, 2 Drawing Sheets

TRANSFORMER HOUSING AND CONNECTOR BUSHING

FIELD OF THE INVENTION

The present invention relates to transformers for neon lights and the like.

BACKGROUND OF THE INVENTION

A neon or florescent light typically includes a transformer connected in its power supply circuit. The transformer converts the AC line voltage available from the wall outlet to a voltage suitable for illuminating the light.

The transformer is typically mounted in a multiple compartment protective housing, formed of conductive metal. One compartment typically contains the transformer, and other compartments enclose connections to the AC power and to the light. Typically the latter compartments are similar in form to an electrical junction box, in which leads from the transformer (e.g., the primary winding) are connected to external leads (e.g., power conductors carrying AC power) by twisting the conductors and securing the connections with wire nuts.

Multiple compartment housings are expensive to fabricate, thus, there is a need to reduce the number of compartments in a transformer housing structure. A two-compartment structure is shown in U.S. Pat. No. 5,168,422 of Richard C. Duncan, assigned to Allanson Division of Jannock Limited. This structure includes a main compartment containing the transformer and a secondary compartment adjacent the main compartment. The primary leads of the transformer lead from the main compartment into the secondary compartment and are connected therein to the AC power leads as in a conventional junction box. In the main compartment, the transformer is covered with asphalt insulating compound. The secondary leads of the transformer connect to terminals which extend vertically upward from the asphalt compound, and terminate in threaded upper ends. The threaded upper ends of the terminals are used as connectors for the load leads connected to the light; threaded caps screw onto the terminals to hold the load leads to the terminals.

While the two-compartment housing structure described above reduces cost by reducing the number of compartments, other difficulties have arisen. First, it can be difficult and costly to manufacture the main compartment so that the secondary terminals extend properly from the insulating compound. Second, the insulating compound in the main compartment is subject to "tracking", i.e., insulative breakdown across its surface, leading to leakage from the secondary terminals to each other or the electrically grounded housing.

Thus, there remains a need for a transformer housing structure with a small number of compartments which is simple to manufacture and not subject to breakdown leakage at the secondary leads.

SUMMARY OF THE INVENTION

In accordance with principles of the present invention, a transformer housing includes, in a primary compartment containing the transformer, insulative bushings attached to the walls of the housing which permit connection of the transformer winding leads to load terminals, while insulating the terminals away from the housing walls and eliminating any tracking across the transformer encapsulation material.

In specific embodiments, the housing walls include mounts having keyed apertures, and the bushings include bayonet flanges suitable for engagement to the mounts. Each bushing includes a connector stud extending generally away from the bushing surface which contains the bayonet flanges. The stud does not extend through the bushing, but rather terminates inside the bushing, thus insulating the stud from the housing wall.

In another aspect, the invention features a bushing, as described above, for use in a transformer housing.

In further specific embodiments, the bushing features a set pin inserted through the bushing and into the connector stud, retaining the stud into the bushing. A nut screwed onto the stud draws the pin into frictional engagement with the bushing and prevents removal of the pin and stud from the bushing. Further nuts retain the secondary leads and load leads to the stud. The stud may be slotted to facilitate connection to wiring from the load.

The above and other objects and advantages of the present invention shall be made apparent from the accompanying drawings and the description thereof.

BRIEF DESCRIPTION OF THE DRAWING

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION OF SPECIFIC EMBODIMENTS

Figure 1:
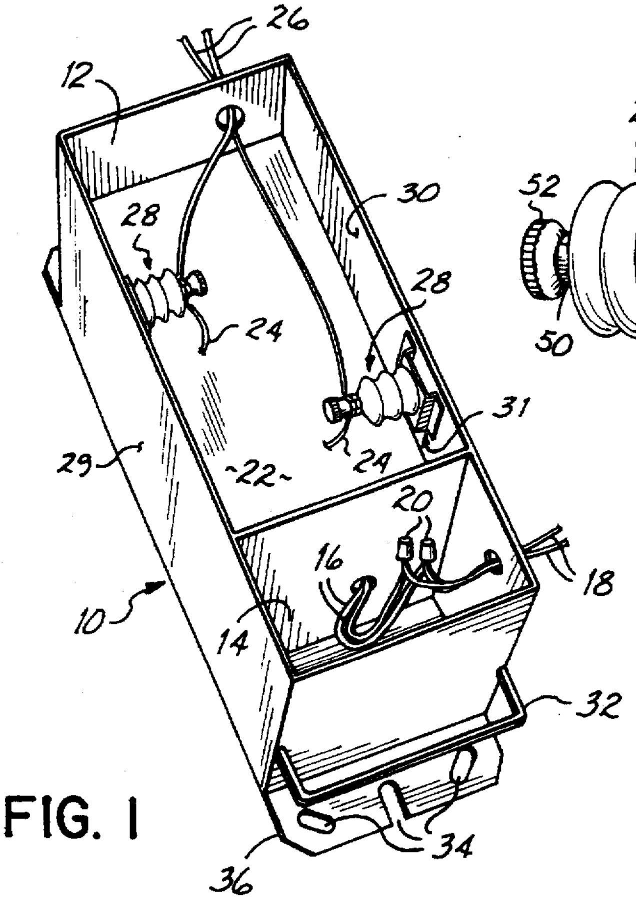
FIG. 1 is a perspective view of a transformer housing in accordance with principles of the present invention.
Figure 3:
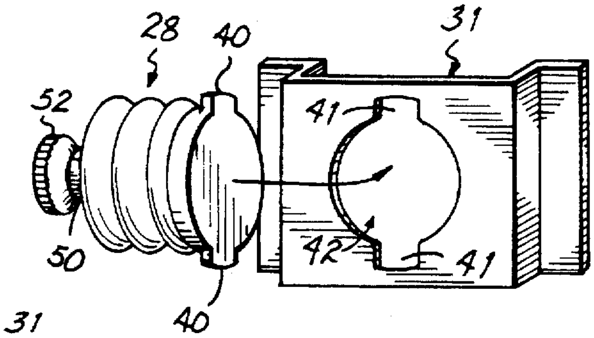
FIG. 3 is an exploded partial perspective view of a bushing and mount shown in FIGS. 1 and 2.

Referring to FIG. 1, a transformer housing 10 in accordance with principles of the present invention includes a main compartment 12 and an auxiliary compartment 14. Main compartment 12 contains the transformer core 13 (FIG. 3) which is manufactured of magnetically permeable material and couples magnetic fields between a primary winding 15 (FIG. 3) and a secondary winding 17 (FIG. 3). Inside of main compartment 12, the transformer is covered with an electrically insulating asphalt compound 22 which completely encases the transformer inside of main compartment 12.

The primary winding terminates in two primary leads 16 which emerge from main compartment 12 into auxiliary compartment 14. In auxiliary compartment 14 the primary leads 16 are connected to power leads 18 which are connected to the electrical power source. The connections may take any form but in the illustrated embodiment the connections are wire nuts 20 which are twisted onto the bare ends of primary leads 16 and power leads 18.

The secondary winding terminates in two secondary leads 24 which emerge from the insulating compound 22. Secondary leads 24 are connected to load leads 26 at terminal connections inside of main compartment 12. The electrical terminal connections are supported by bushings 28 which are mounted to walls 29 and 30 of main compartment 12. Mounts 31 which are affixed to walls 29 and 30 of main compartment 12 support bushings 28. Mounts 31 are affixed to walls by welding or by any other suitable method. Mounts 31 comprise U-shaped brackets as shown.

Handle 32 is used to transport transformer housing 10. Housing 10 is mounted to a supporting structure by screws (both not shown) inserted through apertures 34 in flange 36 which extends from the bottom wall of housing 10. After connections are made to the load leads 26 and power leads 18, housing 10 is covered with a lid (not shown) to completely encase the transformer bushings 28 and connections.

Figure 2:
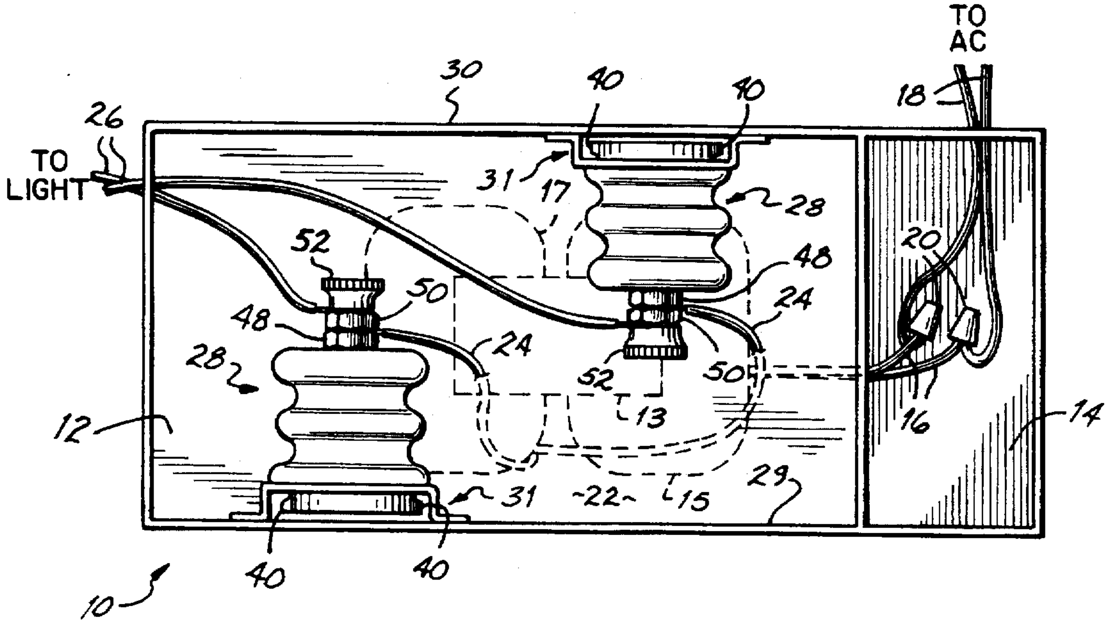
FIG. 2 is a plan view of the housing of FIG. 1.

Referring to FIG. 2, secondary leads 24 are connected to load leads 26 by connections at connector studs 38 (see FIG. 4) which are supported by bushings 28. Bushings 28 are in turn supported by mounts 31 through a bayonet locking mechanism shown in further detail in FIG. 3.

Referring to FIG. 3, bushings 28 include two preferably opposed but possibly offset flanges 40 which extend outwardly from a circular base of the bushing. Mount 31 includes a keyed aperture 42 having a circular outline and including two outward notches 41 sized to accommodate flanges 40. To mount a bushing 28 onto mount 31 the bushing is inserted with flanges 40 keyed into the notches 41 in aperture 42 of mount 31. Then bushing 28 is rotated until flanges 40 lock behind the circular sections of aperture 42, thus holding bushing 28 to mount 31.

Other mechanical lock structures can be used to mount bushings to walls 29 and 30, including an interference fit between the bushings and mount 31, screwing the bushings into a threaded mount 31, or inserting a screw from outside wall 29 and 30 and into the bushing (so long as the screw does not contact or come close enough to connector stud 38 (see FIG. 4) to permit arcing between the screw and stud 38).

Figure 4:
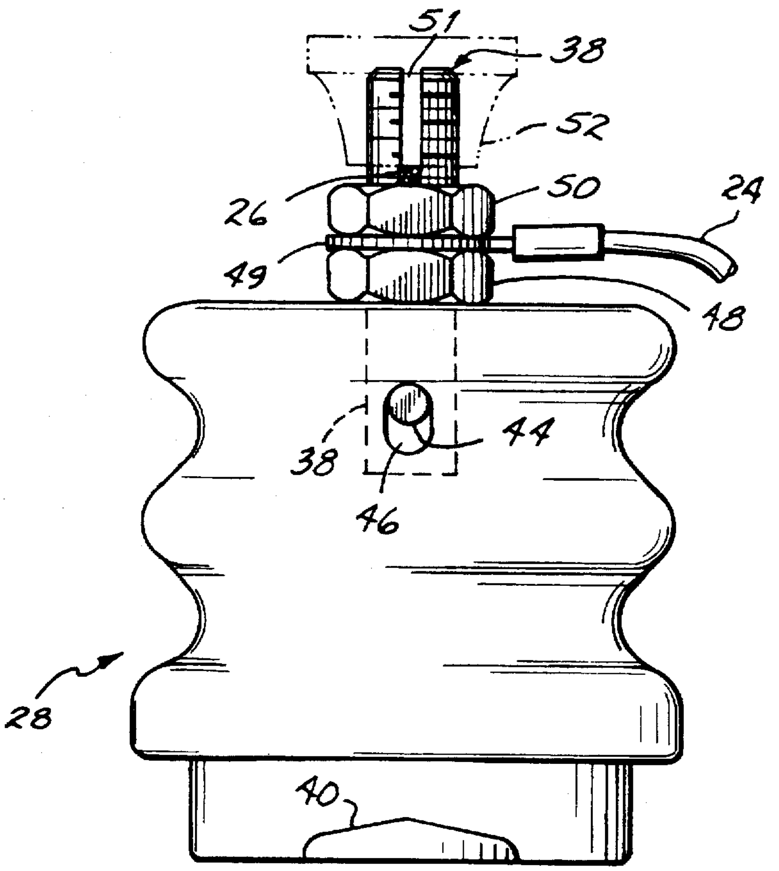
FIG. 4 is an elevational view of a bushing in accordance with principles of the present invention.

Referring to FIG. 4, connector stud 38 extends into bushing 28 for about one-half of the length of bushing 28 and terminates inside of bushing 28. A set pin 44 is inserted through bushing 28 via a hole 46 in bushing 28 and into stud 38, retaining stud 38 inside of bushing 28. Stud 38 is threaded so that nuts may be screwed onto stud 38. A nut 48 is screwed onto stud 38 after stud 38 has been inserted into bushing 28, to retain stud 38 in bushing 28. Nut 48 is screwed down onto stud 38 until nut 48 is flush against the upper surface of bushing 28. Nut 48 is torqued onto stud 38 forcing pin 44 into engagement with bushing 28 in hole 46, frictionally preventing pin 44 and stud 38 from removal from bushing 28.

After nut 48 is secured onto connector stud 38, a connector 49 attached to the end of secondary lead 24 is inserted over stud 38 and onto nut 48. Then, a nut 50 is screwed onto stud 38 and into engagement with connector 49, holding connector 49 in engagement with bushing 28 between nuts 48 and 50. When a load lead 26 is to be connected to a secondary lead 24, the stripped end of load lead 26 is inserted into slot 51 of stud 38 and a third nut 52 is screwed onto stud 38 retaining load lead 26 in slot 51 and in engagement between nut 52 and nut 50. The third nut 52 may be Bakelite nut having a knurled outer surface, as shown in the drawings. Such a nut can be manually removed and provides insulation for stud 38.

In accordance with the above structure, there is provided a transformer housing having a small number of compartments and facilitating installation by an end user.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general inventive concept.

What is claimed is:

1. A transformer and housing structure for driving an electric load coupled between two load leads using electric power received from two power leads, comprising a transformer comprising primary and secondary windings electrically connected between two primary and two secondary leads, respectively, said primary and secondary windings being coupled by a magnetically permeable core, a housing including a main compartment enclosing said transformer having walls protecting said transformer, and a mount affixed to one of said walls, at least a first insulating bushing supporting a first electrical connection, said bushing being mounted to said mount and positioned wholly inside said main compartment, wherein one of said secondary leads is connected to one of said load leads by said electrical connection at said insulating bushing, and said insulating bushing supports said electrical connection a sufficient distance away from said walls of said main compartment to substantially prevent electrical arcing from said connection to said walls.

2. The transformer of claim further comprising a second insulating bushing supporting a second electrical connection, said second insulating bushing being mounted to one of said walls of said main compartment, wherein the other of said secondary leads is connected to the other of said load leads at said second electrical connection at said second insulating bushing, and said first and second insulating bushings respectively support said first and second electrical connections a sufficient distance away from each other and said walls of said main compartment to substantially prevent electrical arcing from said connections to each other and to said walls.

3. The transformer of claim 1 wherein said bushing includes a mechanical lock formed in said bushing for attaching said bushing to said housing.

4. The transformer of claim 3 wherein said mount has a keyed aperture and said mechanical lock includes bayonet flanges suitable for engagement to said keyed aperture of said mount.

5. The transformer of claim 3 wherein said bushing includes a stud forming said electrical connection, extending generally outward from a bushing surface and generally away from said mechanical lock, and wherein said stud terminates inside of said bushing.

6. The transformer of claim 5 wherein said bushing further includes a set pin inserted through said bushing and into said stud, said set pin retaining said stud into said bushing.

7. The transformer of claim 6 wherein said stud is threaded, and further comprising a first nut screwed onto said stud and drawing said stud outward from said bushing, thereby drawing said pin into frictional engagement with said bushing and preventing removal of said pin and stud from said bushing.

8. The transformer of claim 7 further comprising at least a second nut screwed onto said stud.

9. The bushing of claim 5 wherein said stud is threaded and slotted.

10. The transformer of claim 1 wherein said housing is a rectangular housing.

11. The transformer of claim 1 wherein said housing includes an auxiliary compartment separated from said main compartment, said two primary leads extend from said main compartment into said auxiliary compartment, and said two primary leads are respectively connected to said two power leads by electrical connectors located within said auxiliary compartment.

12. An insulating bushing for use in a transformer housing, comprising a body formed of insulating material, a mechanical lock formed in said body for attaching said bushing to said housing, an electrical connector stud extending generally outward from said body and generally away from said mechanical lock, said stud terminating at an inner end inside of said bushing, and having an exposed outer end, wherein said body of insulating material encloses said inner end of said stud to inhibit electrical conduction from said inner end of said stud to said housing through said body.

13. The bushing of claim 12 wherein said mechanical lock comprises two outward projections interlockable with a bayonet aperture in said housing.

14. The bushing of claim 12 further comprising a set pin inserted through said body and into said stud, said set pin retaining said stud into said body.

15. The bushing of claim 14 further comprising a first nut screwed onto said stud and drawing said stud outward from said pin, thereby drawing said pin into frictional engagement with said body and preventing removal of said pin and stud from said bushing.

16. The bushing of claim 15 further comprising at least a second nut screwed onto said stud for retaining an electrical lead.

17. The bushing of claim 12 wherein said stud is threaded and has a slot, whereby a nut may be screwed onto said stud to retain an electrical lead inside of said slot.

18. A transformer housing comprising:

a transformer receiving compartment defined by walls about a transformer, at least one insulating bushing mounted on one of said walls, said bushing comprising a body formed of insulating material, an electrical connector stud extending generally outward from said body, said stud terminating at an inner end inside of said bushing, and having an exposed outer end, wherein said body of insulating material encloses said inner end of said stud to inhibit electrical conduction from said inner end of said stud to said housing through said body.

19. A housing as in claim 18 wherein said bushing is provided with a first component of a bushing support and wherein a second component of a bushing suppoer is mounted on said one wall, said components being operably engageable to mount said bushing on said wall.

* * * * *

UNITED STATES PATENT AND TRADEMARK OFFICE
CERTIFICATE OF CORRECTION

PATENT NO. : 5,742,489

DATED : April 21, 1998

INVENTOR(S) : David H. Riesland

It is certified that error appears in the above-identified patent and that said Letters Patent is hereby corrected as shown below:

Column 4, line 32, Claim 2, after "claim", insert --1--.

Column 6, line 31, Claim 19, delete "bushing suppoer", insert --bushing support--.

Signed and Sealed this

Fourth Day of May, 1999

Attest:

Q. TODD DICKINSON

Attesting Officer

*Acting Commissioner of Patents and Trademarks*